(12) United States Patent
Rees et al.

(10) Patent No.: US 7,621,494 B2
(45) Date of Patent: Nov. 24, 2009

(54) FIXING DEVICE FOR A CURRENT SENSOR

(75) Inventors: Jochen Rees, Waldshut-Tiengen (DE); Nürten Halavart, Zürich (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 12/007,871

(22) Filed: Jan. 16, 2008

(65) Prior Publication Data

US 2008/0174970 A1    Jul. 24, 2008

(30) Foreign Application Priority Data

Jan. 24, 2007   (DE)  .................. 10 2007 004 534

(51) Int. Cl.
*A47H 5/00*   (2006.01)
*A47H 1/10*   (2006.01)

(52) U.S. Cl. .................. 248/300; 248/317; 248/318

(58) Field of Classification Search .................. 248/317, 248/318, 214, 220.21, 300, 309.1, 48.1, 48.2; 42/712, 715; 211/94.01

See application file for complete search history.

(56) References Cited

U.S. PATENT DOCUMENTS

| 2,919,879 | A | * | 1/1960 | Hume | .................. 248/205.1 |
| 2,920,853 | A | * | 1/1960 | Bufogle | .................. 248/214 |
| 3,057,117 | A | * | 10/1962 | Singer | .................. 52/11 |
| 4,059,328 | A | | 11/1977 | Rigo | |
| 2005/0247653 | A1 | * | 11/2005 | Brooks | .................. 211/94.01 |

FOREIGN PATENT DOCUMENTS

DE      600 21 565 T2      5/2006

OTHER PUBLICATIONS

German Search Report.

* cited by examiner

*Primary Examiner*—Amy J. Sterling
(74) *Attorney, Agent, or Firm*—Buchanan Ingersoll & Rooney PC

(57) ABSTRACT

The disclosure specifies a fixing device for a current sensor, which fixing device comprises a holding element which is shaped in the manner of a U and a surface part which is connected to the free end of a limb of the holding element, with the surface part being arranged substantially perpendicular to the connected limb and extending away from the opening in the holding element. The fixing device also comprises a retaining element which is connected to the surface part and is shaped in the manner of a C, with the orientation of the opening in the retaining element corresponding substantially to the orientation of the opening in the holding element. By means of the fixing device for a current sensor, mounting can be simplified, carried out more quickly and performed in a manner which is less susceptible to faults.

17 Claims, 3 Drawing Sheets

FIXING DEVICE FOR A CURRENT SENSOR

RELATED APPLICATION

This application claims priority under 35 U.S.C. §119 to German Patent Application No. 10 2007 004 534.6 filed in the German Patent Office on 24 Jan. 2007, the entire contents of which are hereby incorporated by reference in their entireties.

TECHNICAL FIELD

The disclosure relates to the field of fastening technology. It is based on a fixing device for a current sensor.

BACKGROUND INFORMATION

Today, current sensors are employed in many applications, predominantly in power-electronics circuits, for example drive converters, traction converters and many others. The current sensor is normally installed in a switchgear cabinet with the corresponding circuit. In order to fasten the current sensor in the switchgear cabinet, said sensor is fixed, for example in the switchgear cabinet, by means of screw connections. When there are a plurality of current sensors, as is typical, they are fixed in the switchgear cabinet individually. In this case, the measurement cables of the individual current sensors have to be separately conducted in each case and likewise fastened in the switchgear cabinet. Furthermore, the cables with the currents to be measured also have to be supplied to the individual current sensors in each case and likewise fixed in the switchgear cabinet. Space in the switchgear cabinet is often very limited, as a result of which mounting is further made more difficult. Overall, mounting of the current sensor or sensors is therefore highly complicated, susceptible to faults on the part of the mounting and service personnel due to the large number of individual fixings, and also time-consuming.

DE 600 21 565 T2 and U.S. Pat. No. 4,059,328 each specify a fixing device of this generic type.

SUMMARY

A fixing device for a current sensor is disclosed, by means of which fixing device mounting can be simplified, carried out more quickly and performed in a manner which is less susceptible to faults.

A fixing device for a current sensor is disclosed, comprising a holding element which is shaped in the manner of a U, a surface part which is connected to the free end of a limb of the holding element, with the surface part being arranged substantially perpendicular to the connected limb and extending away from the opening in the holding element, and a retaining element which is connected to the surface part and is shaped in the manner of a C, with the orientation of the opening in the retaining element corresponding substantially to the orientation of the opening in the holding element.

Figure 1:
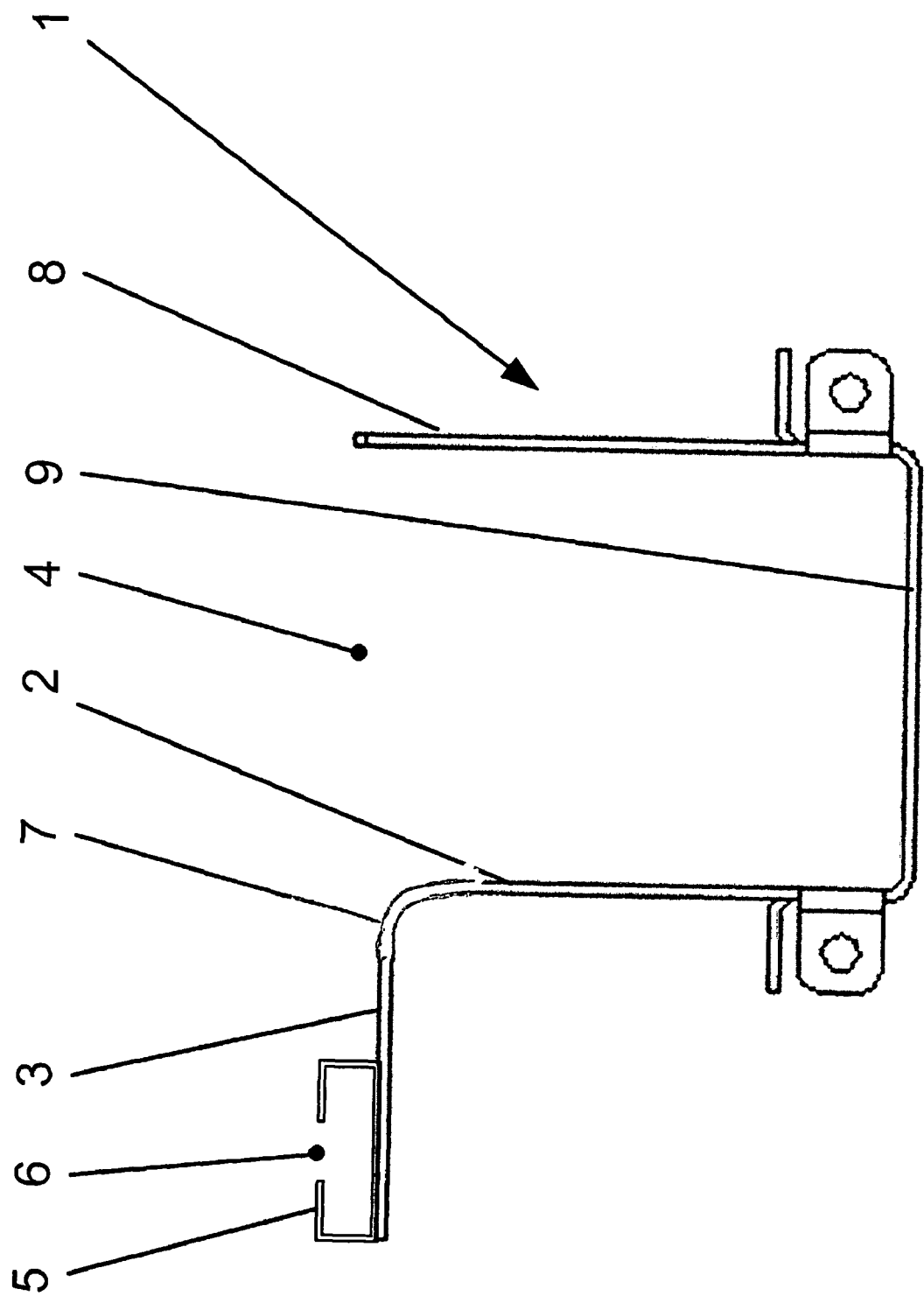
FIG. 1 shows a front view of one exemplary embodiment of a fixing device according to the disclosure for a current sensor.

The reference symbols used in the drawing and their meanings are listed in summary form in the list of reference symbols. In principle, the same parts are provided with the same reference symbols in the figures. The described embodiments represent examples of the subject matter of the disclosure and do not have any restrictive effect.

DETAILED DESCRIPTION

The fixing device according to the disclosure for a current sensor comprises a holding element which is shaped in the manner of a U and a surface part which is connected to the free end of a limb of the holding element, with the surface part being arranged substantially perpendicular to the connected limb and extending away from the opening in the holding element. The fixing device also comprises a retaining element which is connected to the surface part and is shaped in the manner of a C, with the orientation of the opening in the retaining element corresponding substantially to the orientation of the opening in the holding element. The current sensor can advantageously be inserted in a very simple manner between the two limbs of the u-shaped holding element and then be fixed, for example by screw connection. As a result, advantageous premounting of the current sensor or a plurality of current sensors on the fixing device is possible outside of final installation and therefore, for example, outside typically restricted space conditions within a switchgear cabinet. After the premounting, the fixing device only has to be finally mounted, for example in said switchgear cabinet. A cable retaining device can advantageously be inserted into the c-shaped retaining element, which is connected to the surface part, and, for example, be fixed in a very simple manner to the base of the c-shaped retaining element by clamping by means of a screw connection. Cables with the currents to be measured by means of the current sensor or sensors then only further have to be fastened to the cable retaining device and conducted to the current sensor or sensors which are then laid close by. Overall, mounting of the current sensor or sensors can therefore be simplified since a large number of individual fixings are dispensed with. Mounting can also be performed more quickly and with a lower susceptibility to faults.

Figure 2:
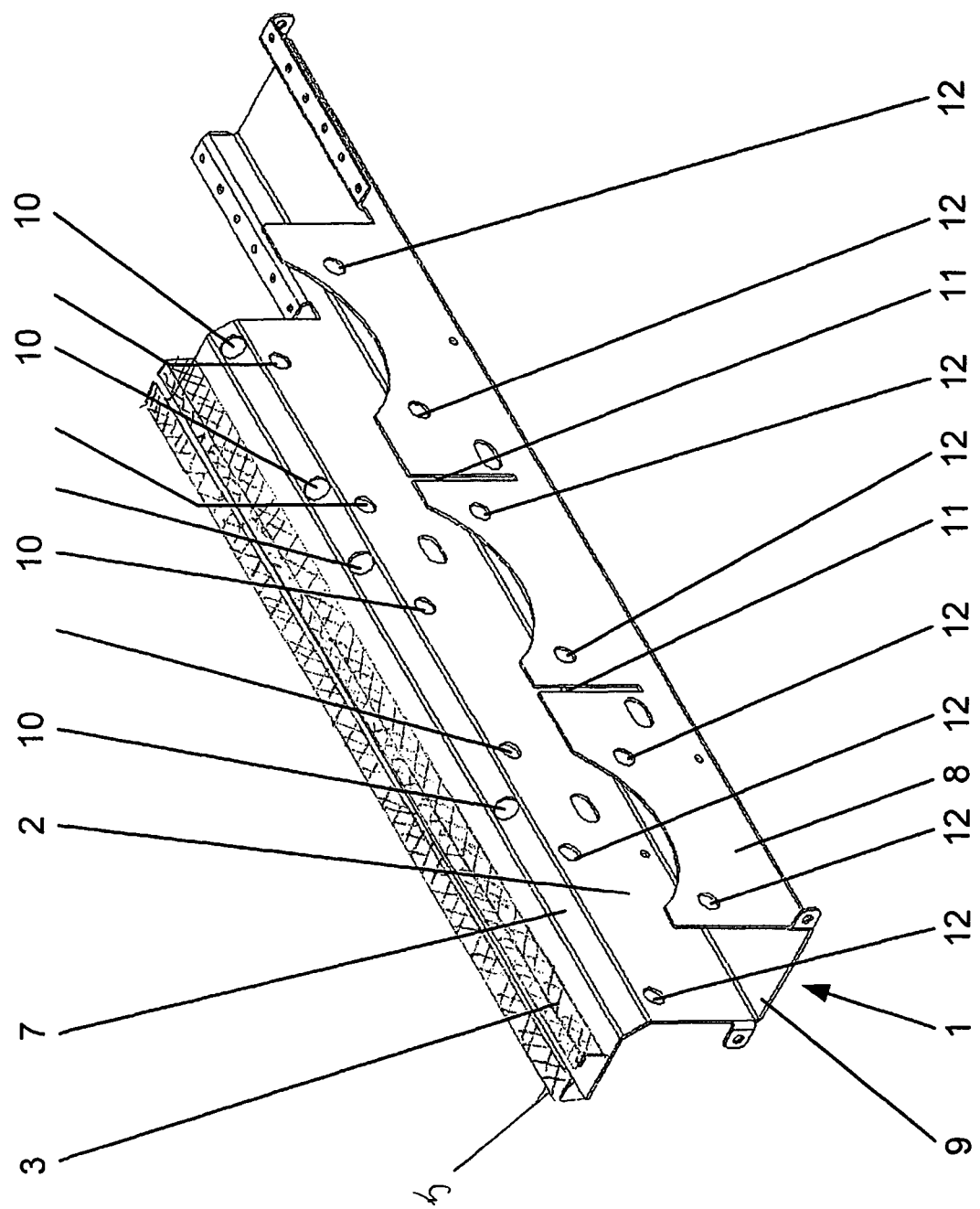
FIG. 2 shows a three-dimensional view of the exemplary embodiment of the fixing device according to the disclosure from FIG. 1.
Figure 3:
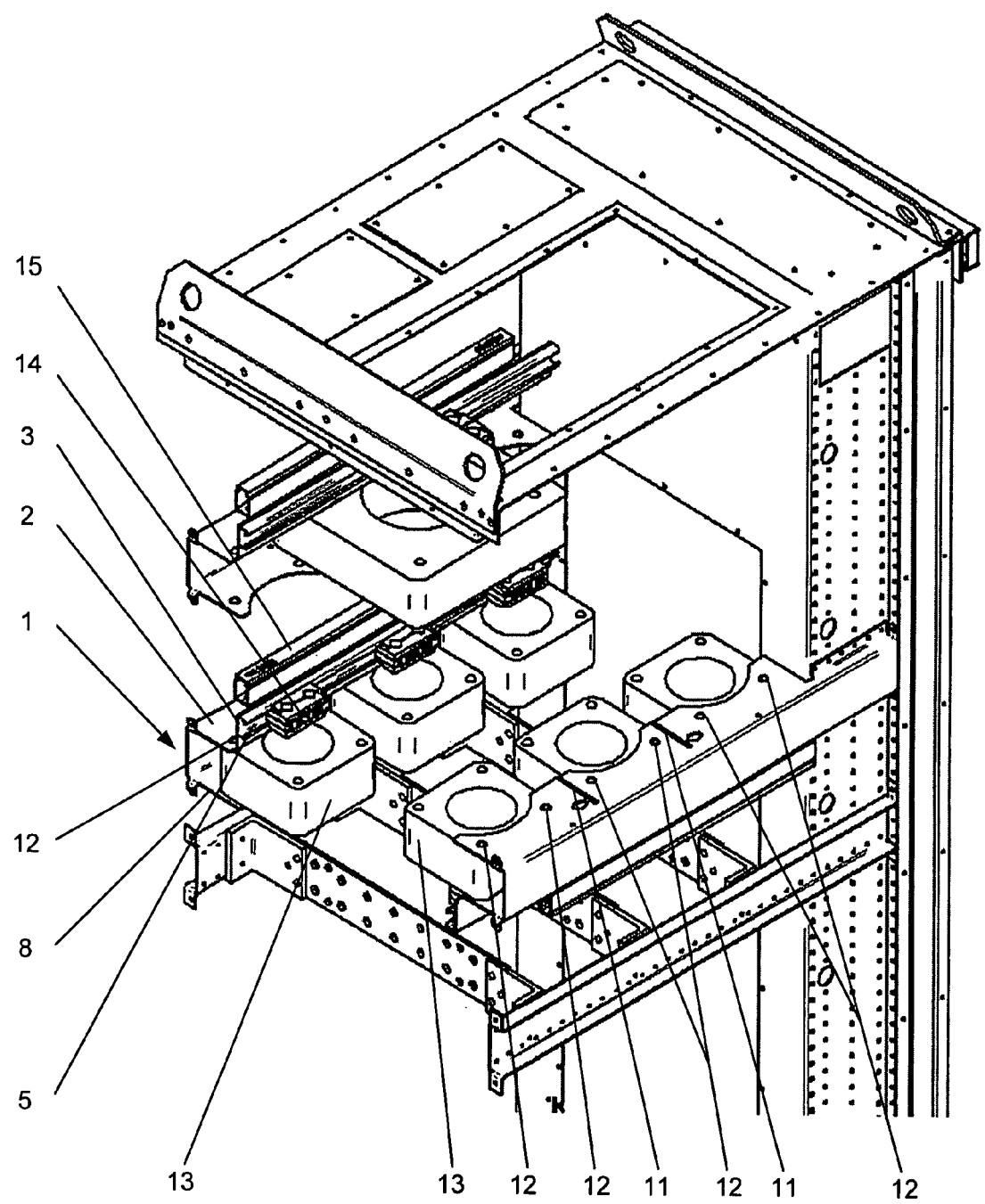
FIG. 3 shows installation of the fixing device according to the disclosure in the switchgear cabinet.

FIG. 1 illustrates a front view of one exemplary embodiment of a fixing device according to the disclosure for a current sensor. The fixing device comprises a holding element 1 which is shaped in the manner of a U and a surface part 3 which is connected to the free end of a limb 2 of the holding element 1, with the surface part 3 being arranged substantially perpendicular to the connected limb 2 and extending away from the opening 4 in the holding element 1. The fixing device from FIG. 1 also comprises a retaining element 5 which is connected to the surface part 3 and is shaped in the manner of a C, with the orientation of the opening 6 in the retaining element 5 corresponding substantially to the orientation of the opening 4 in the holding element 1, that is to say the opening 6 in the retaining element 5 points substantially in the same direction as the opening 4 in the holding element 1. FIG. 2 shows a three-dimensional view of the exemplary embodiment of the fixing device according to the disclosure from FIG. 1, with the c-shaped retaining element 5 not being illustrated in FIG. 2 for reasons of clarity. Furthermore, FIG. 3 illustrates installation of the fixing device according to the disclosure in the switchgear cabinet. On account of the fixing device, the current sensor can advantageously be inserted in a very simple manner between the two limbs 2, 8 of the u-shaped holding element 1 and then be fixed, for example by screw connection. As a result, advantageous premounting of the current sensor 13 or a plurality of current sensors 13 on the fixing device is possible outside of final installation and therefore, for example, outside typically restricted space conditions within a switchgear cabinet. After the premounting, the fixing device only has to be finally mounted, for example in said switchgear cabinet, as shown in FIG. 3. A cable retaining device 14 can advantageously be inserted, in particular laterally and not at the opening 6 in the retaining device 5, into the c-shaped retaining element 5, which is connected to the surface part 3, and, for example, be fixed in a very simple manner to the base of the c-shaped retaining element 5 by clamping by means of a screw connection. Cables with the currents to be measured by means of the current sensor or sensors 13 then only further have to be fastened to the cable retaining device 14 and conducted to the current sensor or sensors 13 which are then laid close by and by means of which said current or currents can then be measured. Overall, mounting of the current sensor or sensors 13 can be simplified by means of the fixing device since a large number of individual fixings, and therefore complex operations, are dispensed with. Mounting can therefore be performed more quickly and with a lower susceptibility to faults.

The holding element 1 can be integral with the surface part 3. The production of the holding element 1 with the surface part 3 is therefore very easily possible, for example by corresponding bending, from a single plate. Further production methods such as deep-drawing in conjunction with bending of a single plate or joining and adhesive-bonding, welding or soldering of individual plate parts for integrally forming the holding element 1 and the surface part 3 are likewise feasible. It is also feasible for surface part 3 to be integral with the retaining element 5, with the retaining element 5 then being joined, for example, to the surface part 3 and being adhesively bonded, welded, soldered or screw-connected to the retaining element 5 in order to integrally form the surface part 3 and the retaining element 5. The fixing device is therefore realized in very simple manner.

According to FIG. 1, the free end of one of the limbs 2 of the holding element 1 is connected to the surface part 3 by means of a connection surface 7. The connection surface 7 can be in the form of a planar surface, as shown in FIG. 1. By means of the connection surface, high electrical fields can advantageously be avoided in the region "free end of one of the limbs 2 of the holding element-surface part 3" which can occur in this region due to points and corners. The risk of partial discharges in said region is therefore low. A further reduction in the high electrical fields and therefore a further reduction in the risk of partial discharge in the region "free end of one of the limbs 2 of the holding element-surface part 3" can be achieved by the connection surface 7 being in the form of a curved surface, that is to say bent surface. The holding element 1 can be integral with the connection surface 7 and with the surface part 3, with the production options already mentioned above for achieving integral formation and the associated advantages being available.

According to FIG. 2, the connection surface 7 has at least one leadthrough 10 through which measurement cables of the current sensor 13 can advantageously be conducted and laid in a cable duct 15, as shown in FIG. 3 by way of example, and conducted further. Conducting and fastening the measurement cables separately, for example within a switchgear cabinet, as is customary at present, is thus greatly simplified or is entirely dispensed with, as a result of which mounting is simplified overall.

According to FIG. 2, a slot 11 is provided on the limb 8 of the holding element 1 without the connected surface part 3, said slot 11 extending from the free end of one of the limbs 8 of the holding element 1 in the direction of the base 9 of the holding element 1. The slot 11 mechanically decouples, for example, two current sensors 13 which are fixed between the limbs 2, 8 of the u-shaped holding element 1, so that, for example, each separate current sensor 13 can be inserted between the limbs 2, 8 of the holding element 1 and then be fixed, for example by means of screw connection, before the next current sensor 13 is inserted and fixed. When a current sensor 13 is replaced, on account of a defect for example, the slot 11 likewise has the advantage of mechanical decoupling in the sense that only the defective current sensor 13 has to be released from its fixing and removed, whereas the other current sensor 13 can remain in place. When there are a plurality of slots 11, the slots 11 can be arranged parallel to one another and equidistant on the limb 8 of the holding element 1 without the connected surface part 3. The arrangement of a plurality of current sensors 13 when there are a plurality of slots 11 is illustrated in FIG. 3.

According to FIG. 2 and FIG. 3, each limb 2, 8 of the holding element 1 has at least one continuous hole 12 in the region of the free end of the respective limb 2, 8. In each case one continuous hole 12 in one of the limbs 2, 8 can be arranged so as to be aligned with in each case one continuous hole 12 in the other limb 2, 8. After the current sensor 13 is inserted between the limbs 2, 8 of the holding element 1, the limb 2, 8 can be passed through the in each case two holes 12 which are arranged so as to be aligned with one another. As a result of the screw being tightened, the limbs 2, 8 of the holding element 1 are then drawn toward one another and press against the current sensor 13 in order to fix it. A further option for fixing the current sensor 13 is provided if the current sensor 13 itself has at least one continuous hole. The screw can then advantageously be passed first through the continuous hole 12 in one of the limbs 2, 8, then through the continuous hole in the current sensor 13, and subsequently through the continuous hole in the other limb 2, 8, and then be tightened, as a result of which improved fixing of the current sensor 13 can be achieved and, in addition, undesired slipping of the current sensor 13 out of the limbs 2, 8 can be prevented, even when the screw is loose.

A fixing device for a current sensor 13 has been described above. However, it should be expressly mentioned that the use of the fixing device is not restricted to a current sensor 13 but can be used for any electronic components.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

1 Holding element
2 Limb of the holding element with the connected surface part
3 Surface part
4 Opening in the holding element
5 Retaining element
6 Opening in the retaining element
7 Connection surface
8 Limb of the holding element without the connected surface part
9 Base of the holding element 10 Leadthrough
11 Slot
12 Continuous hole
13 Current sensor
14 Cable retaining device
15 Cable duct

What is claimed is:

1. A fixing device for a current sensor, comprising
a holding element which is shaped in the manner of a U,
a surface part which is connected to a free end of a first limb of the holding element, with the surface part being arranged substantially perpendicular to the connected first limb and extending away from the opening in the holding element, and
a retaining element which is connected to the surface part and is shaped in the manner of a C, with the orientation of the opening in the retaining element corresponding substantially to the orientation of the opening in the holding element,
wherein the free end of the first or a second limb of the holding element is connected to the surface part by means of a connection surface; and
wherein the connection surface has at least one leadthrough.

2. The fixing device as claimed in claim 1, wherein the surface part is integral with the retaining element.

3. The fixing device as claimed in claim 1, wherein the holding element is integral with the surface part.

4. The fixing device as claimed in claim 1, wherein the connection surface is in the form of a planar surface.

5. The fixing device as claimed in claim 1, wherein the connection surface is in the form of a curved surface.

6. The fixing device as claimed in claim 1, wherein the holding element is integral with the connection surface and with the surface part.

7. The fixing device as claimed in claim 1, wherein a slot is provided on a second limb of the holding element, said slot extending from a free end of second limb the limbs of the holding element in a direction of the base of the holding element.

8. The fixing device as claimed in claim 7, wherein, when there are a plurality of slots, the slots are arranged parallel to one another and equidistant on the second limb of the holding element.

9. The fixing device as claimed in claim 1, wherein the first limb and a second limb of the holding element has at least one hole in the region of the free end of the respective limb.

10. The fixing device as claimed in claim 9, wherein in each case one continuous hole in one of the limbs is arranged so as to be aligned with in each case one continuous hole in the other limb.

11. The fixing device as claimed in claim 2, wherein the holding element is integral with the surface part.

12. The fixing device as claimed in claim 2, wherein the free end of one of the limbs of the holding element is connected to the surface part by means of a connection surface.

13. The fixing device as claimed in claim 5, wherein the holding element is integral with the connection surface and with the surface part.

14. The fixing device as claimed in claim 6, wherein the connection surface has at least one leadthrough.

15. The fixing device as claimed in claim 1, wherein a slot is provided on a second limb of the holding element, said slot extending from the free end of the second limb of the holding element in the direction of the base of the holding element.

16. The fixing device as claimed in claim 8, wherein each limb of the holding element has at least one continuous hole in the region of the free end of the respective limb.

17. A fixing device for a sensor, comprising
a holding element which is substantially U-shaped, the holding element having a limb and an opening,
a surface part connected to a free end of the limb of the holding element, with the surface part being arranged substantially perpendicular to the connected limb and extending away from the opening in the holding element, and
a retaining element which is connected to the surface part and is substantially C-shaped, the retaining element having an opening of an orientation substantially corresponding to the orientation of the opening in the holding element,
wherein the free end of the first or a second limb of the holding element is connected to the surface part by means of a connection surface; and
wherein the connection surface has at least one leadthrough.

* * * * *